United States Patent [19]

Kausche et al.

[11] 4,020,222
[45] Apr. 26, 1977

[54] THIN FILM CIRCUIT

[75] Inventors: Helmold Kausche, Munich; Alois Schauer, Gruenwald, both of Germany

[73] Assignee: Siemens Aktiengesellschaft, Berlin & Munich, Germany

[22] Filed: June 18, 1975

[21] Appl. No.: 587,965

[30] Foreign Application Priority Data

June 19, 1974  Germany ................... 2429434

[52] U.S. Cl. .................... 428/209; 96/36.2; 174/68.5; 174/126 F; 204/192 F; 361/274; 338/308; 427/79; 427/99; 427/102; 427/126; 428/195; 428/210; 428/432; 428/457; 428/472

[51] Int. Cl.² .................................. B05D 5/12

[58] Field of Search ........... 427/126, 99; 204/192; 428/195, 209, 457, 433, 210

[56] References Cited

UNITED STATES PATENTS

| | | | |
|---|---|---|---|
| 3,489,656 | 1/1970 | Balde | 427/99 |
| 3,627,577 | 12/1971 | Steidel | 204/192 X |
| 3,737,343 | 6/1973 | Basseches et al. | 204/192 X |
| 3,738,919 | 6/1973 | Chilton et al. | 204/192 X |

Primary Examiner—Ralph S. Kendall
Attorney, Agent, or Firm—Hill, Gross, Simpson, Van Santen, Steadman, Chiara & Simpson

[57] ABSTRACT

A thin film circuit consisting of a planar substrate of insulating material and a thin metal film formed from an alloy of aluminum with between 2 to 20 atom percent tantalum from which resistors and capacitors are developed. The metal film has an equivalent composition to a film which is formed by means of reactive cathode sputtering. In particular, the film is equivalent to a film formed using a cathode of aluminum and tantalum which is reactively sputtered in a sputtering atmosphere containing oxygen with a low partial pressure. In such an arrangement, the temperature coefficient of resistance and the capacity temperature coefficient compensate one another. The alloy films have a high oxidation stability and the resistors and capacitors therefrom have a high resistance to aging.

8 Claims, 3 Drawing Figures

THIN FILM CIRCUIT

BACKGROUND OF THE INVENTION

1. Field of the Invention

The field of art to which this invention pertains is "Thin Film Circuits", and in particular to thin film circuits for forming resistor and capacitor elements by deposition on a planar substrate of insulating material.

2. Description of the Prior Art

In tantalum thin film technology, tantalum nitride films are conventionally used for resistors, and β-tantalum films are conventionally used for capacitors. The production of integrated RC-thin film circuits takes place, for example, in such a manner that the capacitors are created from β-tantalum on one substrate, the resistors are created from tantalum nitride on another substrate, and that, finally, both substrates are joined together. If one desires to produce RC-networks on a common substrate, a reciprocal disturbance arises in the production processes of the resistors and capacitors, which can be eliminated through additional measures.

A significant problem exists in that sandwich films of tantalum nitride and β-tantalum cannot be selectively etched. It was, therefore, initially proposed that intermediary films of tantalum pentoxide (U.S. patent application Ser. No. 409,656 now U.S. Pat. No. 3,406,043; ) or aluminum (U.S. patent application Ser. No. 409,890 now U.S. Pat. No. 3,387,952 ) be inserted between the tantalum nitride film and the β-tantalum film. Through the utilization of tantalum pentoxide, which normally is an insulator, the electrical losses of the circuit are, however, greatly increased, whereas the selective etching of tantalum over aluminum is problematic. Moreover, the procedures become complicated through the utilization of three films in each case.

An improved solution to this problem is described in the journal "Proceedings, 1970, Electric Components Conference", Washington, Pages 602–612. According to this known method β-tantalum is initially sputtered, etched, and partially formed, whereupon tantalum nitride is deposited over the entire surface. The oxide film created by the formation of the β-tantalum serves as an etching barrier in the etching of the tantalum nitride, so that tantalum nitride can be removed from the desired places without causing the β-tantalum underneath to be also etched away. In the continued course of the known method of production, the annealing required for the stabiliztion of the resistors impairs the dielectric characteristics of the tantalum pentoxide, which must be restored by means of a second formation of the capacitor zones.

The large number of method steps required in this known procedure, however, has a negative effect on the yield of the networks, and thereby on the economy. The production of thin film-RC-networks on a common substrate for resistors and capacitors would be much easier if one could produce resistors and capacitors with the required features, instead of from two primary films, from a single primary film. This problem is discussed in the above-mentioned journal on Page 602, in the second paragraph of the right column. It is also stated therein, that, on the basis of known techniques, a solution of this problem was not possible, or only possible with insufficient preciseness.

In U.S. patent application Ser. No. 408,100, now Pat. No. 3,955,039 sputtered Al-Ta-alloy films with approximately 2 to 20 atom percent tantalum in aluminum are indicated, which are distinguished by their high oxidation stability and great anodization sparking potential.

DETAILED DESCRIPTION FOR THE DRAWINGS

DESCRIPTION OF THE PREFERRED EMBODIMENTS

Figure 1:
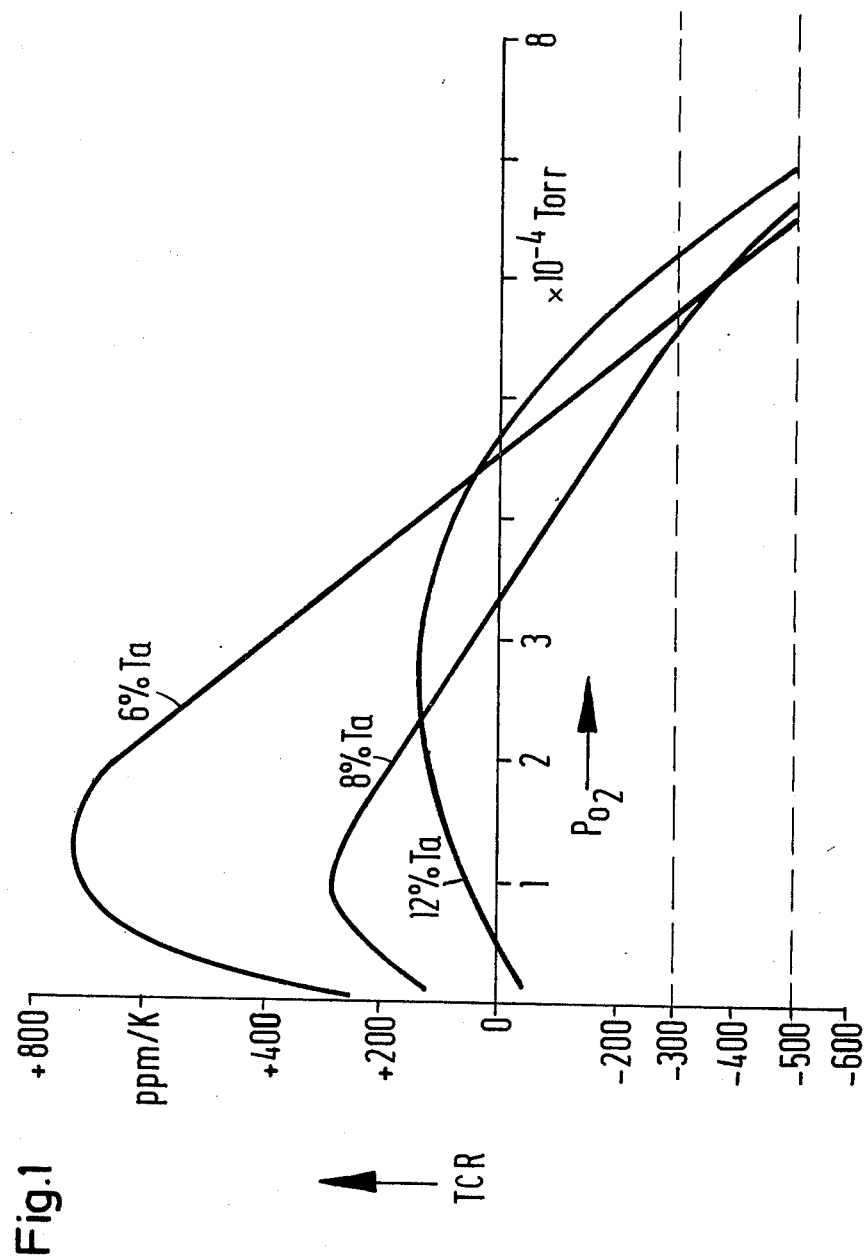
FIG. 1 is a graph showing the dependency of the temperature coefficient of the resistor on the partial pressure of the oxygen in the sputtering atmosphere and the dependency of the tantalum amount under and conditions of a special ring discharge device.

The task of the present invention is the development of a material which can serve as a base film for resistor-capacitor-networks. Such base films must fill the following requirements:

1. High oxidation stability.
2. Suitability for high-grade capacitors.
3. The specific resistance $\rho$ must be in an acceptable range, so that, with a thickness of the base film, which is sufficient for the fabrication of capacitors, for example, 350 nm, a sheet resistance in the range between 50 and 100 Ohm per square results.
4. The resistors fabricated from this base film must be moisture-proof; current noise and voltage (coefficient) depency must be low. The same holds true for the resistance variation during loading with voltage impulses.
5. The temperature coefficient of the resistors (TCR) and capacitors (TCC) fabricated from the base film must allow a compensation (TCR = –TCC).

This problem is solved in a thin film circuit comprising a planar substrate of insulating material, supported by said substrate at least one metal film, from which are made by photolithographic techniques the capacitors as well as the resistors, said metal film consisting of an alloy of aluminum with between 2 and 20 atom percent tantalum and containing oxygen in an amount sufficient so that the temperature coefficient of the resistors is between –300 and –500 ppm/K in order to compensate the positive TCC of the capacitors with the negative TCR of the resistors in RC-networks.

This values of the TCR are important for the production of temperature-compensated RC-networks, since the capacitors produced from the same material have normally a temperature coefficient (TCC) of approximately +500 ppm/K. By annealing of the networks the TCC of the capacitors decreases till values of about +300 ppm/K.

Preferably, the metal film has an amorphous structure.

The specific resistance $\rho$ of those films, whose TCR is in the range –300 to –500 ppm/K, is between 2500 and 3700 $\mu\Omega$cm; it increases with increasing tantalum content. With a film thickness of 350 to 400 nm, which is used to an advantage in the fabrication of capacitors, a sheet resistance of 70 to 100 Ohm per square results. The sheet resistance thus is located in the value range previously mentioned, which is particularly suited for resistor fabrication.

Glass is preferably used as substrate for the fabrication of the inventive thin film circuit, the surface of the glass is covered with tantalum pentoxide as a barrier for the etching process.

The method for the production of a thin film circuit as descripted above consists preferably in that the metal film is produced by means of reactive cathode sputtering of a composed aluminum-tantalum-cathode having a composition equal to the desired alloy and in a sputtering atmosphere containing oxygen with a low partial pressure thereafter by means of forming a dielectric layer on said metal film and by means of defining resistor and capacitor portions of said film.

A preferred embodiment of this method consists in that the metal film is produced by means of ring discharge sputtering of a composed aluminum-tantalum-cathode with a voltage of 600 V and a current of 2 A in a sputtering atmosphere containing oxygen with a partial pressure in the range from 0.2 to $7 \times 10^{-4}$ Torr. With said sputtering voltage and current a partial pressure of approximately $7.5 \times 10^{116}$ Torr (0.1 N/m$^2$) is adjusted for the Argon, used as sputtering gas. With a sputtering period of 12 to 15 minutes, approximately 400 nm thick films are deposited.

Cathode sputtering devices with ring discharge plassmma under utilization of a composed cathode, is described in the German Letters Patent 1,515,311 corresponding to U.S. Pat. No. 3,716,472.

Resistors and capacitors are fabricated from the films deposited in this manner, with the aid of photolithographic techniques. The current connection contacts consist preferrably of vapor-deposited chromium-nickel-gold-films. The aluminum- tantalum-base film is partially anodized for the fabrication of the capacitor dielectric. The counter-electrode deposited on the dielectric likewise consists preferrably of vapor- deposited chromium-nickel-gold.

Capacitors and resistors from these films have the following characteristics: With an anodization voltage of 200 V, the specific capacity is ca. 330 pF/mm$^2$, and in measuring the capacity current-voltage characteristics, double charging current is obtained only with voltages over 100 V. The capacitors, in contrast to capacitors consisting of $\beta$-tantalum or pure aluminum, are not polar. The capacitor yield is at least as good as with the utilization of $\beta$tantalum films. In extended time-tests, in storage at 125° C., after 10,000 hours, resistors show relative resistance variations, which are within ± 0.3%.

In comparison with the costly known producting methods of RC-networks from tantalum-sandwich films, as described in detail in the literature cited in the intfoduction hereto, in the case of the inventive utilization of the oxygen-containing Al-TA-films, such networks can be fabraicated in a much simpler way. Below, two possible methods are described, whereby the small number of method steps shows the great advance in the inventive utilization of oxygen-containing Al-Ta-films, as opposed to the known film combinations.

Method A

1. Sputtering of the oxygen containing Al-Ta-metal film on a substrate preferrably in a ring discharge sputtering device as described above.
2. Etching of the said Al-Ta-metal film with a suitable etching solution, known for this purposes, to form the shapes of resistor and capacitor areas leaving connecting pathes between them.
3. Forming the capacitor dielectric by partially anodization of said parts of the area of said metal film.
4. Forming of the capacitor counter electrodes and the current connections by evaporation and etching of metal, preferably Cr-Ni-Au-layers.
5. If desired trimming of the resistors by anodical oxidation or by laser beam application and annealing in air the resistors for the stabilization of their specific values.
6. Removing of the above in step 2 mentioned connecting pathes by eching.

Method B

1. Sputtering of the oxygen containing Al-Ta-metal film on a substrate preferrably in a ring discharge sputtering device as described above.
2. Coating of the said metal film with a layer of Cr-Ni-Au by evaporation.
3. Selective etching of the Cr-Ni-Au-layer as well as the Al-Ta-metal film with two different suitable etching solutions, know for these purposes to form the shapes of resistor and capacitor areas as well as current conductors leaving connecting pathes between them.
4. If desired trimming of the resistors by anodical oxidation or by laser beam application and annealing in air the resistors for the stabilization of their specific values.
5. Forming the capacitor dielectric by partially anodization of the said parts of the area of said metal film.
6. Forming of the counter electrodes for the capacitors by evaporating and etching of preferrable Cr-Ni-Au-layers.
7. Removing of the above in step 2 mentioned connecting pathes by etching.

The following description illustrates the invention in connection with an example and with the enclosed drawing.

FIG. 1 is a graph showing the dependency of the temperature coefficient of the resistor on the partial pressure of the oxygen in the sputtering atmosphere and the dependency of the tantalum amount under the condition of the above described special ring discharge.

Figure 2:
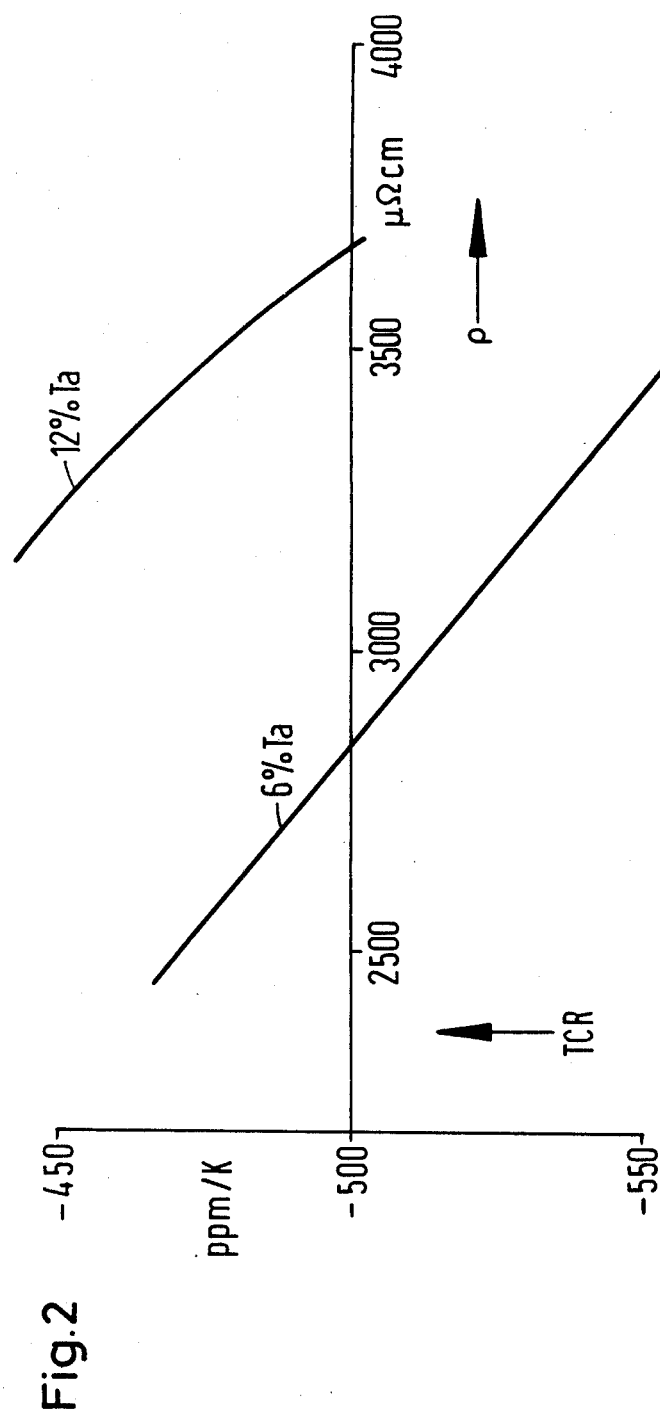
FIG. 2 illustrates the connection between temperature coefficients and specific resistance under and above mentioned conditions.

FIG. 2 illustrates the connection between temperature coefficient and specific resistance under the above mentioned conditions, in the vicinity of a TCR of −500 ppm/K for Al-Ta-alloys with 6 to 12 atom percent Ta.

From the graphs one skilled in the art can see which conditions must be selected for special desired networks.

The graphes in the FIG. 1 and 2 also illustrates, that the preferred range for the oxygen partial pressure by ring discharge sputtering under the described conditions (600 V, 2 A) is between 5.5 and $7 \times 10^{-4}$ Torr.

Figure 3:
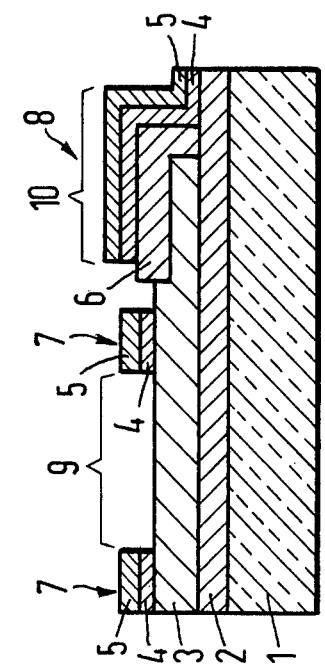
FIG. 3 is a cross-section of a thin film circuit of the present invention showing the various layers which are used to develop a resistor and a capacitor made from identically the same Al-Ta-metal film containing oxygen.

FIG. 3 is a cross-section of a thin film circuit of the present invention showing the various layers which are used to develop a resistor and a capacitor made from identically the same Al-Ta-metal film containing oxygen.

On a glass substrate 1 with a coating 2 of Ta$_2$O$_5$ is located the oxygen containing Al-Ta-metal film 3. Between the two conductor layers 7, which are formed by a first layer 4 of Cr-Ni and a second layer 5 of gold, the resistor part 9 is positioned. The capacitor 10 is formed by a part of the metal film 3, which is partially anodized to form the dielectric layer 6. The remaining part acts as base electrode. The layer 6 is partially covered with layers 4 of Cr-Ni and 5 of Au. This layers 4 and 5 acts as the counter electrode 8.

We claim as our invention:

1. A thin film circuit comprising a planar substrate of insulating material, supported by said substrate at least one metal film, from which are made by photolithographic techniques the capacitors as well as the resistors, said metal film consisting of an alloy of aluminum with between 2 and 20 atom per cent tantalum and containing oxygen in an amount sufficient so that the temperature coefficient of the resistors is between −300 and −500 ppm/K in order to compensate the positive TCC of the capacitors with the negative TCR of the resistors in RC-networks.

2. A thin film circuit in accordance with claim 1 wherein the metal film has an amorphous structure.

3. A thin film circuit in accordance with claim 1 wherein the metal film consists of an alloy of aluminum with 6 to 12 atom percent tantalum.

4. A thin film circuit in accordance with claim 1 wherein the specific resistance of the metal film is in the range between 2500 and 3700 /$\mu\Omega$cm.

5. A thin film circuit in accordance with claim 1 wherein the specific resistance of the metal film is approximately 2800 $\mu\Omega$cm.

6. A thin film circuit in accordance with claim 1 wherein the specific resistance of the metal film is approximately 3700 $\mu\Omega$cm.

7. A thin film circuit in accordance with claim 1 wherein the substrate is a glass substrate and has a coating of $Ta_2O_5$.

8. A thin film circuit in accordance with claim 1 wherein the metal film has a thickness of 350 – 400 nm and a resistance of between 70 and 100$\Omega$ per square.

* * * * *